(12) United States Patent
Sun et al.

(10) Patent No.: US 8,090,068 B2
(45) Date of Patent: Jan. 3, 2012

(54) SYSTEM AND METHOD OF CALIBRATING POWER-ON GATING WINDOW FOR A TIME-TO-DIGITAL CONVERTER (TDC) OF A DIGITAL PHASE LOCKED LOOP (DPLL)

(75) Inventors: Bo Sun, Carlsbad, CA (US); Gurkanwal Singh Sahota, San Diego, CA (US); Zixiang Yang, San Diego, CA (US)

(73) Assignee: QUALCOMM, Incorporated, San Diego, CA (US)

( * ) Notice: Subject to any disclaimer, the term of this patent is extended or adjusted under 35 U.S.C. 154(b) by 925 days.

(21) Appl. No.: 12/107,584

(22) Filed: Apr. 22, 2008

(65) Prior Publication Data
US 2009/0262878 A1  Oct. 22, 2009

(51) Int. Cl.
H03D 3/24 (2006.01)
(52) U.S. Cl. ........................................................ 375/376
(58) Field of Classification Search .................. 375/215, 375/294, 327, 376; 342/103; 370/503; 455/180.3, 455/266; 327/141, 146, 147, 148, 149, 150, 327/156, 157, 158, 159
See application file for complete search history.

(56) References Cited

U.S. PATENT DOCUMENTS

| | | | |
|---|---|---|---|
| 6,593,773 B2 | 7/2003 | Staszewski et al. | |
| 7,183,860 B2 * | 2/2007 | Staszewski et al. | 331/1 A |
| 7,205,924 B2 | 4/2007 | Vemulapalli et al. | |
| 7,778,610 B2 * | 8/2010 | Staszewski et al. | 455/76 |
| 2006/0103566 A1 * | 5/2006 | Vemulapalli et al. | 341/155 |
| 2008/0043894 A1 | 2/2008 | Dedieu et al. | |
| 2008/0297208 A1 * | 12/2008 | Baudin et al. | 327/107 |

OTHER PUBLICATIONS

International Search Report and the Written Opinion—PCT/US2009/041461, International Search Authority—European Patent Office—Jun. 25, 2009.

* cited by examiner

Primary Examiner — Sam K Ahn
(74) Attorney, Agent, or Firm — Larry Moskowitz; William M. Hooks

(57) ABSTRACT

A system and method are disclosed related to calibrating a power-on gating window for a time-to-digital converter (TDC) of a digital phase locked loop (DPLL). The gating window is calibrated to ensure proper operation of the DPLL, while at the same time operating the TDC in a power efficient manner. In particular, the technique entails setting the width of the TDC gating window to a default value; operating the DPLL until the control loop is substantially locked; decreasing the width of the TDC gating window by a predetermined amount, while monitoring the phase error signal generated by the phase error device of the DPLL; determining the current width of the TDC gating window at substantially a time when the phase error arrives at or crosses a predetermined threshold; and increasing the current width of the TDC gating window by a predetermined amount to build in a margin of error for the operating width of the TDC gating window.

21 Claims, 7 Drawing Sheets

SYSTEM AND METHOD OF CALIBRATING POWER-ON GATING WINDOW FOR A TIME-TO-DIGITAL CONVERTER (TDC) OF A DIGITAL PHASE LOCKED LOOP (DPLL)

BACKGROUND

1. Field

The present disclosure relates generally to phase locked loops (PLL), and in particular, to a system and method of calibrating a power-on gating window for a time-to-digital converter (TDC) of a digital phase locked loop (DPLL).

2. Background

Communication devices typically include a local oscillator (LO) for synchronously transmitting and receiving signals to and from other remote communication devices. Often these signals are sent or received via defined frequency channels. For selecting a particular frequency channel, the frequency of the LO is typically changed in order to properly transmit or receive the signal via the selected channel. Often a phase locked loop (PLL), such as a digital PLL (DPLL), is used to perform the change in the LO frequency.

A typical DPLL includes several digital devices, such as an input accumulator, a phase error summing device, a low pass filter (LPF) (often referred to as a "loop filter"), a digital controlled oscillator (DCO), a DCO accumulator including a latch, a time-to-digital converter (TDC), a feedback phase summing device, and other digital devices. The input accumulator generates an input phase signal. The phase error summing device generates a phase error signal indicative of a phase difference between the input phase signal and a feedback phase signal. The loop filter generates a control signal for the DCO by filtering the phase error signal. The DCO generates an output signal having a phase related to the input phase signal when the DPLL is locked. The DCO accumulator including the latch generates a signal indicative of a coarse measurement of the phase of the output signal of the DCO. The TDC generates a signal indicative of a fine measurement of the phase of the output signal of the DCO. And, the feedback summing devices sums the coarse and fine phase signals to generate the feedback phase signal.

The TDC typically comprises a chain of delay elements (e.g., inverters), a plurality of D flip-flops, and a decoder. An output clock from or derived from the output signal of the DCO is applied to the input of the chain of delay elements. The delay elements are coupled to the data input of respective D flip-flops. A reference clock is applied to the clock inputs of the D flip-flops. The Q-outputs of the D flip-flops are coupled to inputs of a decoder, such as a thermometer-to-binary decoder. The inverted reference clock is applied to the clock input of the decoder. And, the outputs of the decoder generates a binary output representing the fractional phase of the phase difference between the output clock and the reference clock.

Typically, the frequency of the output is substantially higher than the frequency of the reference clock, e.g., by a factor of 10 or more. Generally, a phase measurement takes place when an edge of the reference clock arrives. Between adjacent edges of the reference clock, the output clock is still being applied to the chain of delay elements. This causes the delay elements to needlessly consume substantial amount of power during times when a phase measurement is not being performed. Accordingly, power-on gating for the TDC has been developed to apply the output clock to the chain of delay elements only a relatively small window around the edge of the reference clock. However, due to variations in manufacturing processes, environment temperatures, and power supply voltages, the proper size for the gating window for operational and power consumption purposes is generally difficult to ascertain.

SUMMARY

A system and method are disclosed related to calibrating a power-on gating window for a time-to-digital converter (TDC) of a digital phase locked loop (DPLL). The gating window is calibrated to ensure proper operation of the DPLL, while at the same time operating the TDC in a power efficient manner. In particular, the technique entails setting the width of the TDC gating window to a default value; operating the DPLL until the control loop is substantially locked; decreasing the width of the TDC gating window by a predetermined amount, while monitoring the phase error signal generated by the phase error device of the DPLL; determining the current width of the TDC gating window at substantially a time when the phase error arrives at or crosses a predetermined threshold; and increasing the current width of the TDC gating window by a predetermined amount to build in a margin of error for the operating width of the TDC gating window.

Another aspect of the disclosure relates to an apparatus comprising a control unit adapted to receive a phase error signal from a phase error device of a phase locked loop (PLL), such as a digital PLL (DPLL), and set the width of a gated clock signal for a time-to-digital (TDC) converter to an operating value based on the phase error signal. In another aspect, the control unit is adapted to set the width of the gated clock signal to a default value, monitor the phase error signal from the phase error device, and decrease the width of the gated clock signal until the phase error signal arrives substantially at or crosses a predetermined threshold. In yet another aspect, the control unit is further adapted to increase the width of the gated clock signal at the time when the phase error signal arrives substantially at or crosses the predetermined threshold in order to provide a margin of error to the operating value of the width of the gated clock signal.

In another aspect of the disclosure, the control unit comprises a first generator adapted to generate a first gating signal, and a second generator adapted to generate a second gating signal, wherein the first and second gating signals include respective edges that control the width of the gated clock signal. In yet another aspect, the control unit comprises logic adapted to generate the gated clock signal from the first and second gating signals and an output clock signal having a phase related to the phase of the output of the DPLL. In still another aspect, the first generator comprises a first chain of delay elements with respective outputs coupled to inputs of a first multiplexer, and wherein the first chain of delay elements is adapted to receive a raw reference clock. In another aspect, the second generator comprises a second chain of delay elements with respective outputs coupled to inputs of a second multiplexer, and wherein the second chain of delay elements is coupled to an output of the first chain of delay elements.

In another aspect of the disclosure, the control unit further comprises a controller adapted to generate a first select signal to cause the first multiplexer to select one of the output signals of the first chain of delay elements as the first gating signal. Similarly, in another aspect, the controller is adapted to generate a second select signal to cause the second multiplexer to select one of the output signals of the first chain of delay elements as the second gating signal. In yet another aspect, the control unit further comprises a first programmable counter adapted to generate the first select signal in response to the controller, and a second programmable counter adapted to generate the second select signal in response to the controller.

The apparatus discussed above may be used in a digital phase locked loop (DPLL). In this regard, the apparatus further comprises a filter adapted to generate an oscillator control signal based on the phase error signal; an oscillator adapted to generate an output signal based on the oscillator control signal, wherein a phase of the gated clock signal is related to a phase of the output signal; a first accumulator adapted to generate a first feedback phase signal related to a coarse phase measurement of the output signal, wherein the TDC generates a second feedback phase signal related to a fine phase measurement of the output signal; a summing device adapted to generate an overall feedback phase signal by combining the first and second feedback phase signals; and a second accumulator adapted to generate an input phase signal, wherein the phase error signal generated by the phase error device is related to a difference between the input phase signal and the overall feedback phase signal.

Other aspects, advantages and novel features of the present disclosure will become apparent from the following detailed description of the disclosure when considered in conjunction with the accompanying drawings.

DETAILED DESCRIPTION

Figure 1:
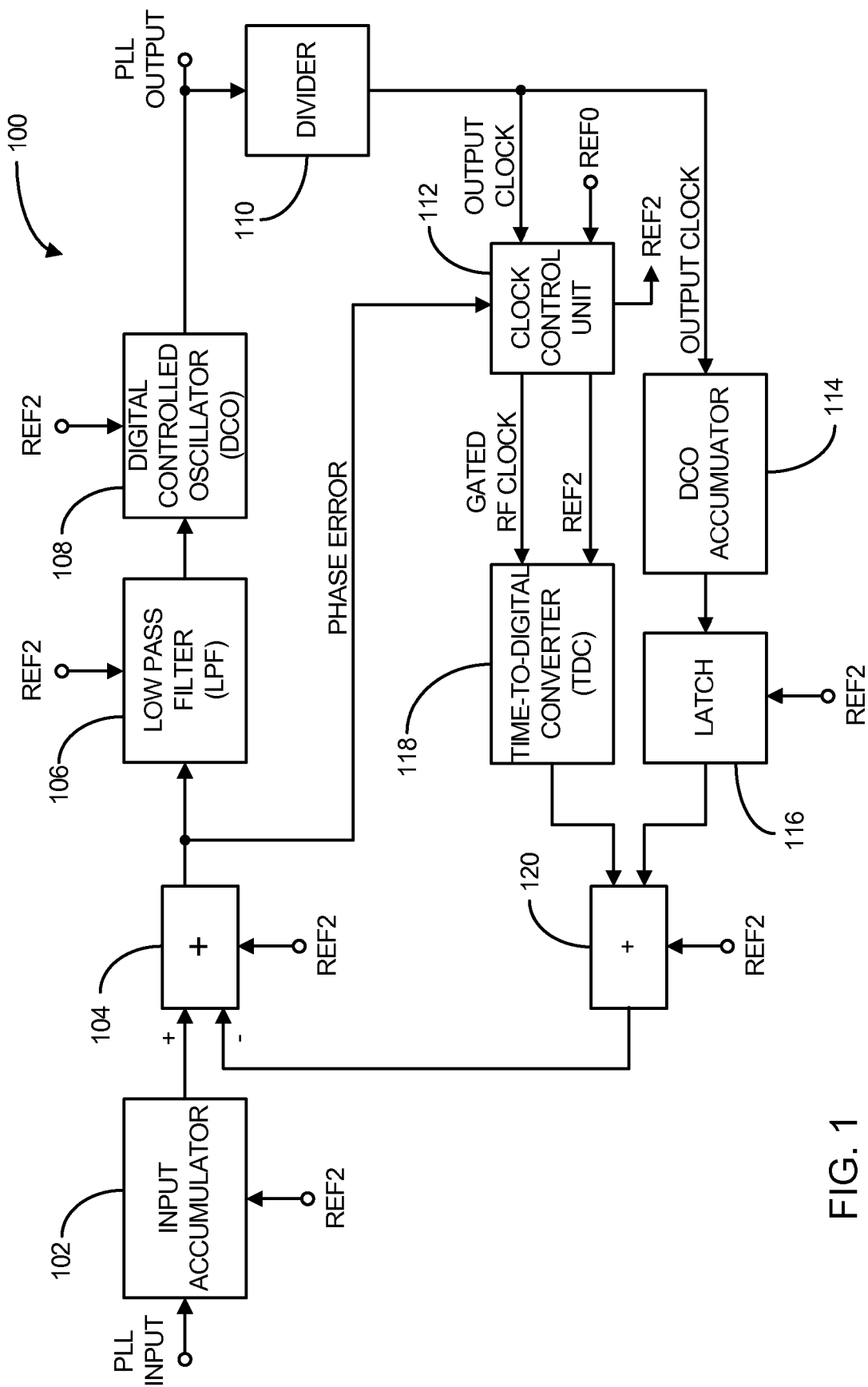
FIG. 1 illustrates a schematic/block diagram of an exemplary digital phase locked loop (DPLL) in accordance with an aspect of the disclosure.

FIG. 1 illustrates a schematic/block diagram of an exemplary digital phase locked loop (DPLL) 100 in accordance with an aspect of the disclosure. In summary, the DPLL provides a technique for calibrating the power-on gating window of a time-to-digital converter (TDC) to achieve proper operation of the DPLL, while at the same time operating the TDC in a power efficient manner. In particular, the technique involves setting the power-on gating window to a default value, operating the DPLL until the control loop is substantially locked, decrementing the power-on gating window while monitoring the phase error signal from the phase error summing device, selecting the current power-on window substantially when the phase error crosses a predetermined threshold, and applying a margin of error to the current power-on window.

More specifically, the DPLL comprises an input accumulator 102, a first (phase error) summing device 104, a low pass filter (LPF) or loop filter 106, a digital controlled oscillator (DCO) 108, a frequency divider 110, a clock control unit 112, a DCO accumulator 114 including a latch 116, a time-to-digital converter (TDC) 118, and a second (feedback phase) summing device 120.

The input accumulator 102 receives a PLL input and a reference clock REF2, and generates an input phase signal. In essence, the input accumulator 102 comprises a counter that counts periods of the reference clock REF2 by a number dictated by the PLL input. For example, if the PLL input is 10, then the counter counts by 10 (e.g., 0, 10, 20, 30, etc.). The PLL input is related to the ratio of the frequency of the DCO output to the frequency of the reference clock REF2. For example, if the frequency of the reference clock REF is 100 MHz and the PLL input is 10, then the frequency of the DCO output (when the loop is locked) may be at approximately 1 GHz.

The first (phase error) summing device 104 receives the input phase signal from the input accumulator 102, and a feedback phase signal from the second (feedback phase) summing device 120, and generates a phase error signal related to the phase difference between the input phase signal and the feedback phase signal. For timing and error correction purposes, the first summing device 104 may receive the reference clock REF2. For example, the first summing device 104 may generate the phase error signal one (1) clock period of the reference clock REF2 after it has received the phase signals from the input accumulator 102 and the second summing device 120. Since the frequency, i.e., the clock period, of the REF2 clock may be programmed, the first summing device 104 receives the reference clock REF2 for the purpose of setting the proper delay for outputting the phase error signal.

The LPF or loop filter 106 filters the phase error signal from the first summing device 104 to generate a frequency control signal for the DCO 108. The transfer function of the loop filter 106 may be dependent on the frequency of the reference clock REF2. Accordingly, the loop filter 106 also receives the reference clock REF2 to inform it of the current frequency of the reference clock REF2. The loop filter 106 uses this information to adjust its transfer function in accordance with the current frequency of the reference clock REF2.

The DCO 110 receives the frequency control signal from the loop filter 106 and the reference clock REF2, and generates the PLL output signal that has a specified phase relationship with the input phase signal when the control loop is locked. Optionally, the frequency divider 110 may be provided to divide the frequency of the output signal of the DCO 108 to generate an output clock with reduced frequency to better facilitate processing. The DCO accumulator 114 generates a signal indicative of a coarse measurement of the phase of the output clock, which is related to the phase of the PLL output signal. In essence, the DCO accumulator 114 comprises a counter that incrementally counts periods of the output clock. The latch 116 outputs the coarse phase information in response to a triggering edge of the reference clock REF2.

As discussed in more detail below, the clock control unit 112 receives the output clock from the frequency divider 110 and a raw reference clock REF0, and generates the reference clock REF2 for the various components of the DPLL and a gated clock for the TDC 118. The gated RF clock includes one or more periods of the RF clock signal timely situated on both sides of each triggering edge of the reference clock REF2. The clock control unit 112 further performs a calibration procedure to determine the width (power-on gating window)

of the output clock to ensure proper operation of the DPLL 100, while at the same time operating the TDC 118 in a power efficient manner. In particular, the technique involves setting the power-on gating window to a default value, operating the DPLL 100 until the control loop is substantially locked, decrementing the power-on gating window while monitoring the phase error signal from the first summing device 104, selecting the current power-on window substantially when the phase error signal crosses a predetermined threshold, and applying a margin of error to the current power-on window.

The TDC 118 generates a signal indicative of a fine measurement of the phase of the output clock, which, as previously discussed, is related to the phase of the PLL output signal. In particular, the TDC 118 comprises a chain of delay elements that receives the gated clock. The outputs of the delay elements are respectively coupled to the data inputs of D flip-flops. The D flip-flops are clocked by the reference clock REF2. The Q-outputs of the D flip-flops are coupled to a thermometer-to-binary decoder, which generates a signal indicative of the fractional difference between the phase of the RF clock and the reference clock REF2. The power consumption of the TDC 118 is related to the width of the power-on gating window. Thus, the wider the power-on gating window, the more power the TDC consumes. Conversely, the narrower the power-on gating window, the less power the TDC consumes. Again, as discussed above, the clock control unit 112 calibrates the width of the power-on gating window to ensure proper operation of the DPLL 100, while operating the TDC 118 in a power efficient manner.

The second summing device 120 receives the coarse and fine phase signals respectively from the latch 116 and the TDC 118, and generates the feedback phase signal related to the phase of the PLL output signal. For timing and error correction purposes, the second summing device 120 may receive the reference clock REF2. For example, the second summing device 120 may generate the feedback phase signal one (1) clock period of the reference clock REF2 after it has received the phase information from the latch 116 and the TDC 118. Since the frequency, i.e., the clock period, of the reference clock REF2 may be programmable, the second summing device 120 receives the reference clock REF2 to inform it of the current frequency of the reference clock REF2. The second summing device 120 uses this information to select the proper delay for outputting the feedback phase signal.

Figure 2:
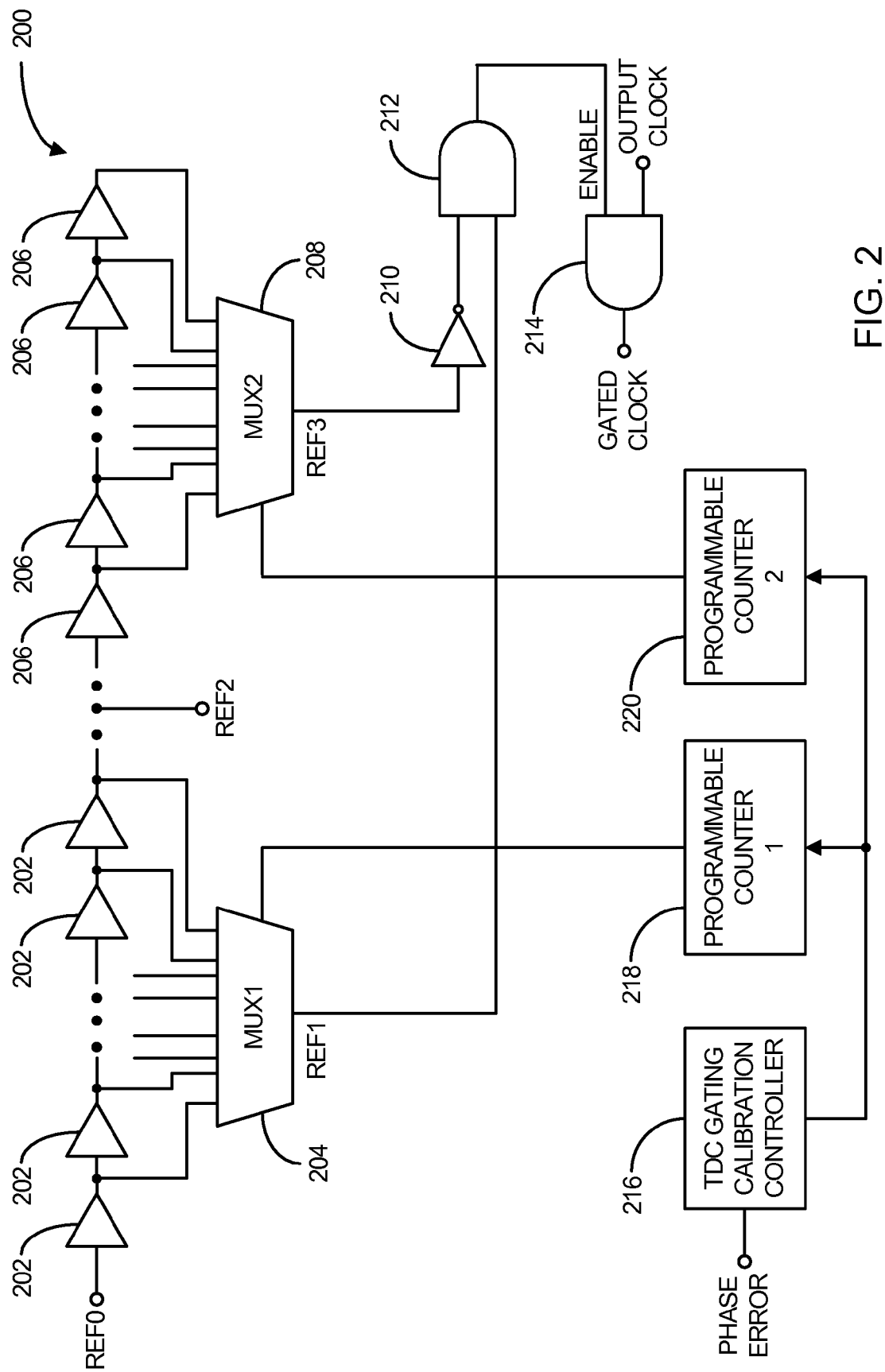
FIG. 2 illustrates a schematic/block diagram of an exemplary clock control unit of the exemplary DPLL in accordance with another aspect of the disclosure.

FIG. 2 illustrates a schematic/block diagram of an exemplary clock control unit 200 in accordance with another aspect of the disclosure. The clock control unit 200 is merely one example of a detailed implementation of the clock control unit 112 previously discussed. In particular, the clock control unit 200 includes circuitry to generating a gated clock for the TDC 118. The clock control unit 200 further includes circuitry for calibrating the width of the gated clock so as to ensure proper operation of the DPLL 100, as well as operate the TDC 118 in a power efficient manner. Additionally, the same circuitry also produces the reference clock REF2 used by many of the components of the DPLL 100 as previously discussed.

More specifically, the clock control unit 200 comprises a first chain of delay elements 202, a first multiplexer (MUX) 204, a second chain of delay elements 206, a second MUX 208, an inverter 210, first and second AND gates 212 and 214, a TDC gating calibration controller 216, a first programmable counter 218, and a second programmable counter 220. The first chain of delay elements 202 includes an input adapted to receive the raw reference clock REF0. The outputs of the delay elements of the chain 202 are respectively coupled to inputs of the first MUX 204. The second chain of delay elements 206 is respectively coupled to the output of the first chain of delay elements 202 either directly or by way of one or more delay elements. The outputs of the delay elements of the chain 206 are respectively coupled to inputs of the second MUX 206.

In response to a selection signal received from the first programmable counter 218, the first MUX 204 selects one of the clock signals from the output of one of the delay elements of the chain 202 to generate a first gating clock REF1. As discussed in more detail below, an edge (e.g., the rising edge) of the first gating clock REF1 defines the beginning of the power-on gating window. Additionally, in response to a selection signal received from the second programmable counter 220, the second MUX 208 selects one of the clock signals from the output of one of the delay elements of the chain 206 to generate a second gating clock REF3. As discussed in more detail below, an edge (e.g., the rising edge) of the second gating clock REF3 defines the end of the power-on gating window. The reference clock REF2 for the DPLL may be generated by a delay element between the first and second chains of delay elements 202 and 206. The reference clock REF2 may be selected so that its triggering edge lies substantially half way between the edge of the first gating clock REF1 and the edge of the second gating clock REF3.

The output of the first MUX 204 is coupled to an input of the AND gate 212, and the output of the second MUX 208 is coupled to the other input of the AND gate 212 via the inverter 210. The AND gate 212 produces at its output an ENABLE signal that defines the width of the power-on gating window. For example, the ENABLE signal includes a rising edge that defines the beginning of the power-on gating window, and a falling edge that defines the end of the power-on gating window. The output of the AND gate 212 is coupled to an input of the AND gate 214. The other input of the AND gate 214 is adapted to receive the output clock from the divider 110, or directly from the DCO 108 is a divider is not used. The ENABLE signal, in essence, gates the output clock so that the gated clock is generated at the output of the AND gate 214.

Figure 3:
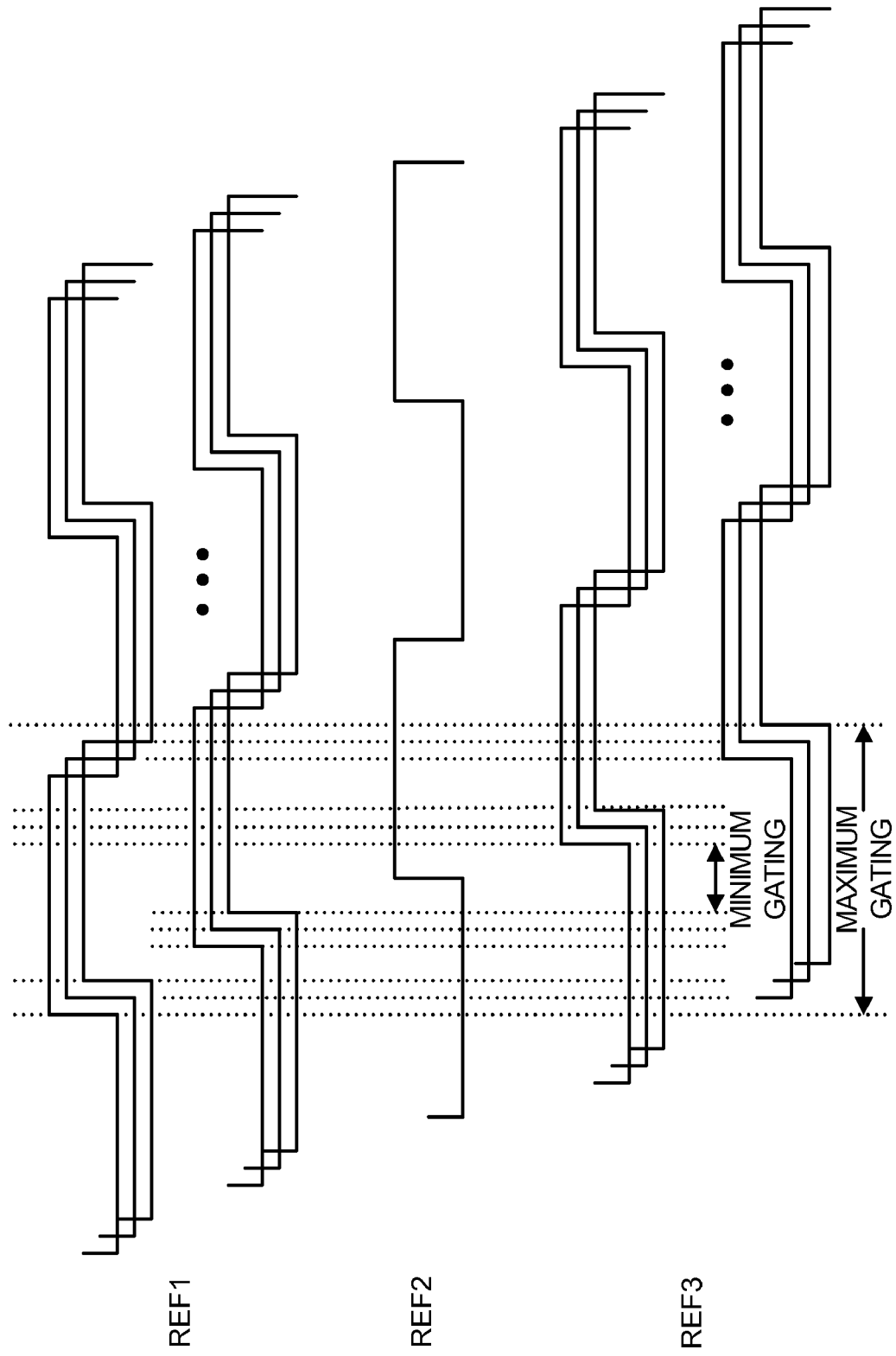
FIG. 3 illustrates a timing diagram of exemplary signals generated within the exemplary clock control unit in accordance with another aspect of the disclosure.

FIG. 3 illustrates a timing diagram of exemplary signals generated within the exemplary clock control unit 200 in accordance with another aspect of the disclosure. The top signal illustrated is the first gating clock REF1, the middle signal illustrated is the reference clock REF2 for the DPLL, and the lower signal illustrated is the second gating clock REF3. As the diagram shows, based on the selection implemented by the first MUX 204, the timing of the first gating clock REF1 may be selectively delayed to define the start of the power-on gating window. In this example, the start of the power-on gating signal is set by the rising edge of the first gating clock REF1. Similarly, based on the selection implemented by the second MUX 208, the timing of the second gating clock REF3 may be selectively delayed to define the end of the power-on gating window. In this example, the end of the power-on gating signal is set by the rising edge of the second gating clock REF3.

Also, as noted in the diagram, the triggering edge (e.g., the rising edge) of the reference clock REF2 may be configured to lie substantially half way between the edge of the first gating clock REF1 and the edge of the second gating clock REF2. Additionally noted in the diagram, the maximum gating occurs when the first gating clock REF1 is delayed the least, and the second gating clock REF3 is delayed the most. Similarly, the minimum gating occurs when the first gating clock REF1 is delayed the most, and the second gating clock REF3 is delayed the least.

Figure 4:
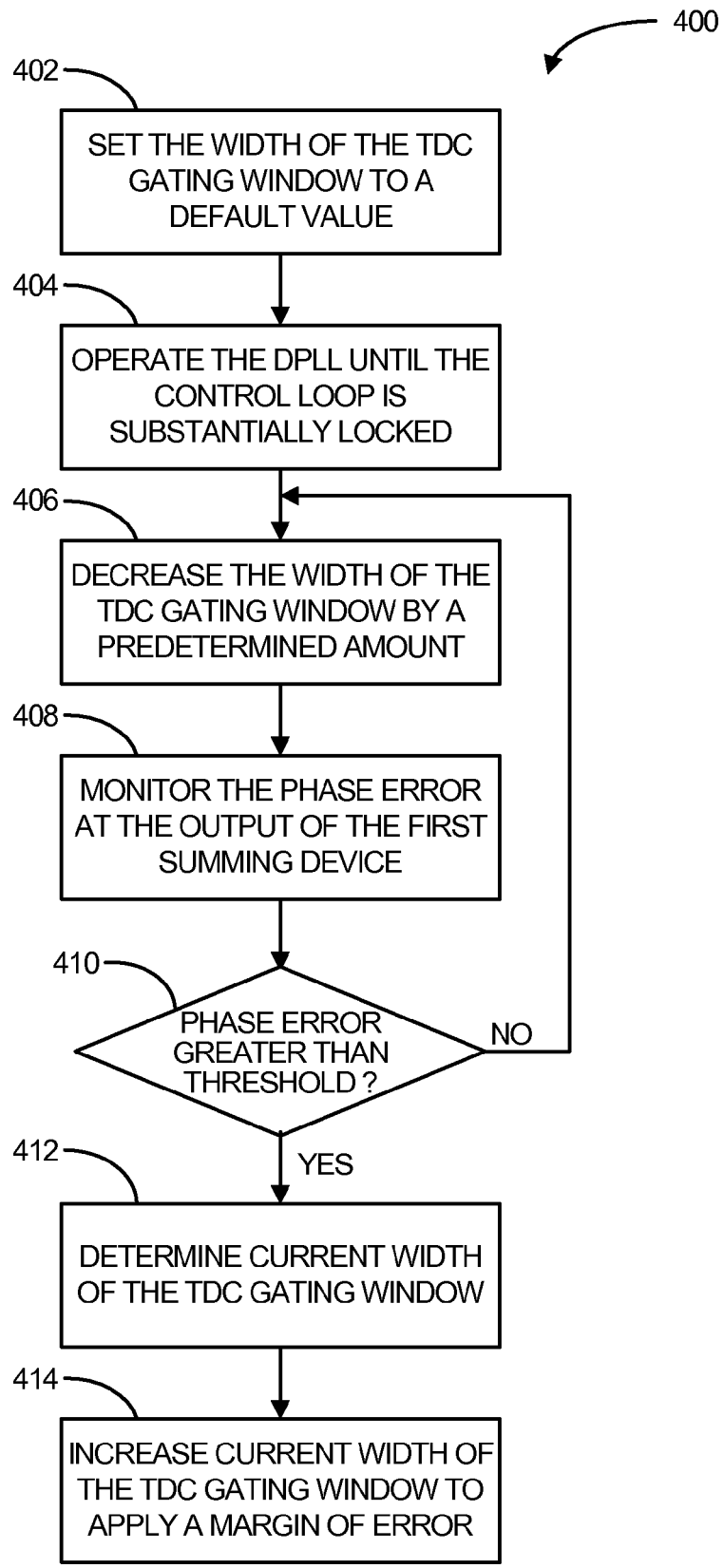
FIG. 4 illustrates a flow diagram of an exemplary method of calibrating a power-on gating window for an exemplary time-to-digital converter (TDC) of the exemplary DPLL in accordance with another aspect of the disclosure.

FIG. 4 illustrates a flow diagram of an exemplary method 400 of calibrating a power-on gating window for an exemplary time-to-digital converter (TDC) of the exemplary DPLL in accordance with another aspect of the disclosure. The width of the power-on gating window of the TDC 118 may be calibrated by the TDC gating controller 216 per method 400. According to the method 400, the controller 216 sets the power-on gating window to a default value (block 402). For example, the controller 216 may set the gating window to the widest gating window provided by the gating clocks REF1 and REF3. This may be accomplished by the controller 216 sending a control signal causing the first programmable counter 218 to generate a select signal that instructs the first MUX 204 to select the output of the first delay element (most left delay element) of the chain 202, and sending a control signal causing the second programmable counter 220 to generate a select signal that instructs the second MUX 204 to select the output of the last delay element (most right delay element) of the chain 206.

Then the DPLL 100 is operated until the control loop is substantially locked (block 404). Then, the controller 216 causes the width of the power-on gating window to decrease by a predetermined amount (block 406). This may be accomplished by the controller 216 sending a control signal causing the first programmable counter 218 to generate a select signal that instructs the first MUX 204 to select the output of the next (e.g., the second) delay element of the chain 202, and sending a control signal causing the second programmable counter 220 to generate a select signal that instructs the second MUX 204 to select the output of the previous (e.g., second to last) delay element of the chain 206.

The controller 216 then monitors the phase error signal generated by the first summing device 104 (block 408). The controller 216 then compares the phase error with a predetermined threshold (block 410). If the controller 216 determines that the phase error is lower than (e.g., has crossed) the predetermined threshold, then the controller repeats blocks 406, 408, and 410. On the other hand, if the controller 216 determines that the phase error is greater than the predetermined threshold, the controller 216 then determines the current width of the TDC gating window (block 412). Then, the controller 216 increases the current width of the TDC gating window to apply a predetermined margin of error (block 414). In this manner, the TDC gating window is wide enough to ensure proper operation of the DPLL, and narrow enough to operate the TDC in the power efficient manner. Although, in this example, the clock control unit 200 included its own calibration controller 216, it shall be understood that the controller 216 may be situated external to the DPLL 100, such as a part of a test equipment for calibrating the power-on gating window in a test facility.

Figure 5:
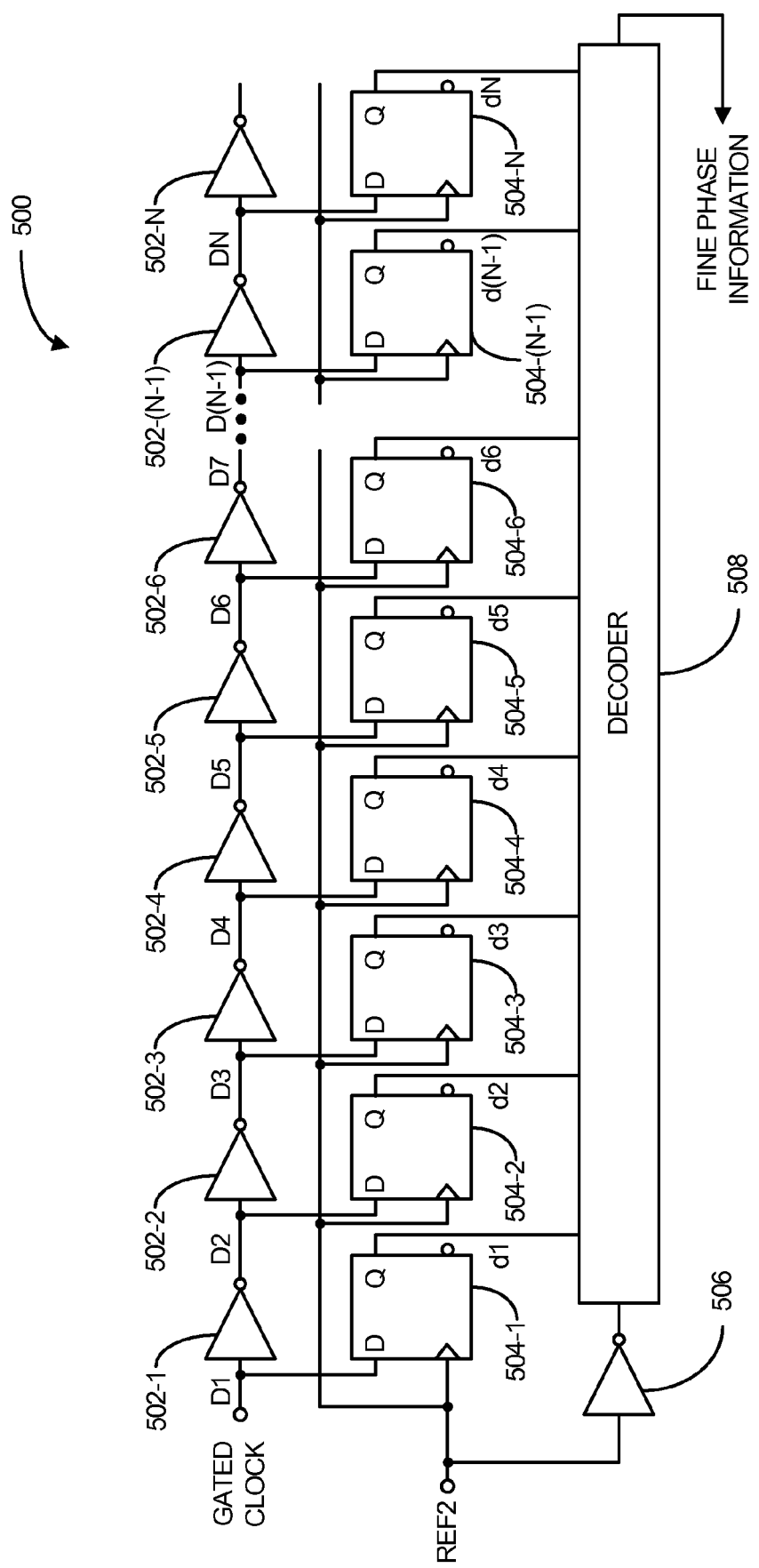
FIG. 5 illustrates a schematic/block diagram of an exemplary time-to-digital converter (TDC) in accordance with another aspect of the disclosure.

FIG. 5 illustrates a schematic/block diagram of an exemplary time-to-digital converter (TDC) 500 in accordance with another aspect of the disclosure. The TDC 500 is one exemplary detailed implementation of the TDC 118 previously discussed. In summary, TDC 500 compares the phase of the gated clock against the phase of the reference clock REF2, and provides the detected phase difference with multiple bits of resolution.

The TDC 500 includes N delay elements 502-1 through 502-N, D flip-flops 504-1 through 504-N, an inverter 506, and a thermometer-to-binary decoder 508. Delay elements 502-1 through 502-N are coupled in series, with delay element 502-1 receiving the gated clock. Each delay element may be implemented with inverters and/or other types of logic elements to obtain the desired delay resolution. Delay elements 502-1 through 502-N may provide a total delay of approximately one output clock cycle. For example, if the output clock frequency is 2 GHz, then one period of the output clock is 500 picoseconds (ps), and each delay element may provide a delay of approximately 500/N ps.

The D flip-flops 504-1 through 504-N have their D inputs coupled to the delay elements 502-1 through 502-N, respectively, and their clock inputs receiving the reference clock REF2. Each D flip-flop samples the input of an associated delay element and provides the sampled output to converter 508. The number of D flip-flops at logic high versus the number of D flip-flops at logic low is indicative of the phase difference between the gated clock and the reference clock REF2. This phase difference may have a resolution of 1/N output clock cycle. The inverter 506 receives the reference clock REF2 and provides an inverted reference clock REF2 to the decoder 508. The decoder 508 receives the N outputs from D flip-flops 504-1 through 504-N, converts these N outputs to a binary value when triggered by an edge of the inverted reference clock REF2, and provides the binary value as the TDC output.

Figure 6:
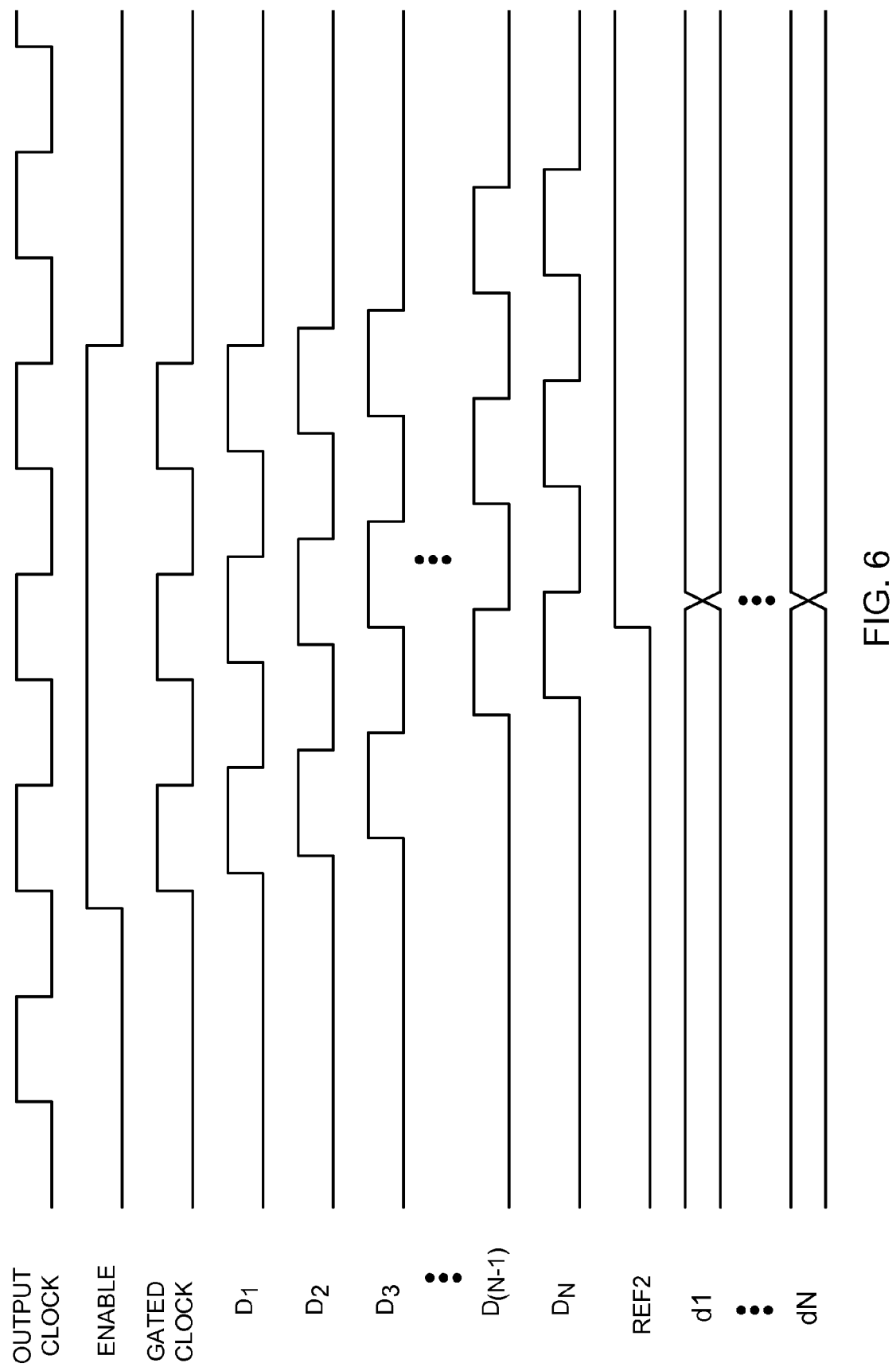
FIG. 6 illustrates a timing diagram of exemplary signals generated within the exemplary time-to-digital converter (TDC) in accordance with another aspect of the disclosure.

FIG. 6 illustrates a timing diagram of exemplary signals generated within the exemplary time-to-digital converter (TDC) in accordance with another aspect of the disclosure. The output clock and the ENABLE signal are shown at the top of the diagram for reference. The gated clock is shown below the ENABLE signal. The N delayed signals $D_1$ through $D_N$ from delay elements 502-1 through 502-N, respectively, are shown below the gated clock. The $D_1$ through $D_N$ signals are latched by the leading edge of the reference clock REF2, which occurs during the power-on gating window defined by the ENABLE. The N latched signals $d_1$ through $d_N$ from D flip-flops 504-1 through 504-N, respectively, are provided to decoder 508.

As shown in FIG. 6, the functionality of TDC 500 is not affected by gating on/off the output clock because the phase information of oscillator 108 is only needed for a short period of time. The gated clock and the $D_1$ through $D_N$ signals are valid for a duration of time around each leading edge of the reference clock REF2. In general, the gated clock may be valid for any number of output clock cycles prior to the leading edge of the reference clock REF2 and for any number of output clock cycles after the leading edge, depending on the calibration procedure previously discussed. However, it may be desirable to minimize the number of clock cycles in the gated clock in order to reduce power consumption. The ENABLE signal may be generated to pass only one or two output clock cycles. In one design, the ENABLE signal may pass approximately one output clock cycle prior to the leading edge and approximately one output clock cycle after the leading edge of the reference clock REF2, as dictated by the calibration procedure. By dynamically controlling TDC 500 and enabling the TDC only when necessary, a large portion (e.g., 90%) of the power may be saved for TDC 500.

Figure 7:
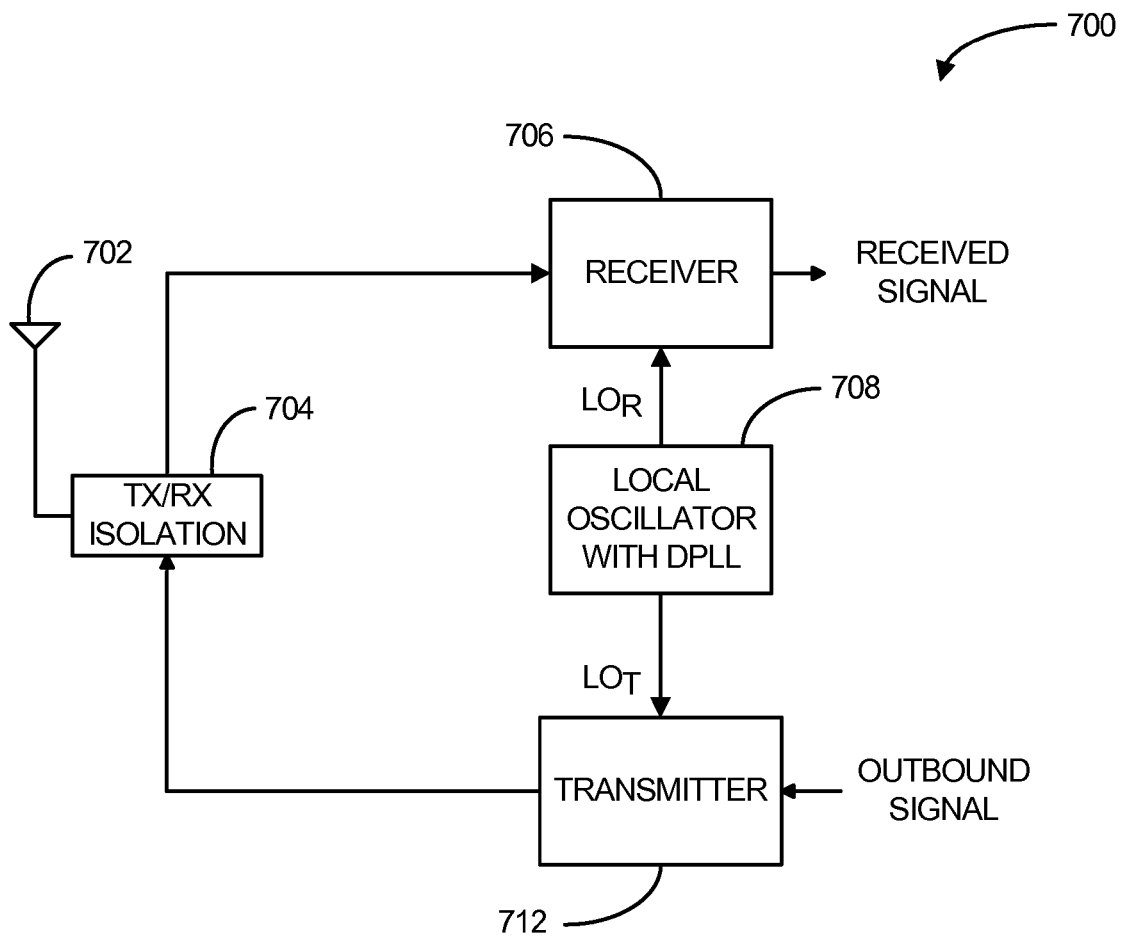
FIG. 7 illustrates a schematic/block diagram of an exemplary communication device in accordance with another aspect of the disclosure.

FIG. 7 illustrates a block diagram of an exemplary communication device 700, such as a transceiver, in accordance with another aspect of the disclosure. In summary, the transceiver 700 serves as one exemplary application of the DPLL previously discussed. In particular, the transceiver 700 includes a DPLL that provides TDC gating for power consumption purposes. The DPLL may further include a device, such as the clock control unit previously discussed, that is capable of calibrating the width of the power-on gating window in order to ensure proper operation of the DPLL, and at the same time, operate the TDC in a power efficient manner as previously discussed.

More specifically, the transceiver 700 comprises an antenna 702, a transmit/receive (TX/RX) isolation device 704, a receiver 706, a local oscillator (LO) 708 including a DPLL as previously discussed, and a transmitter 712. The antenna 702 serves to receive radio frequency (RF) signals from one or more remote communication devices via a wireless medium, and to transmit RF signals to one or more remote communication devices via the wireless medium. The TX/RX isolation device 704 serves to route the received signal to the receiver 706, and route the transmit signal to the antenna 702 while substantially isolating the input of the receiver 706 from the transmit signal. The receiver 706 serves to down convert the received RF signal to an intermediate frequency (IF) or baseband signal. The transmitter 712 serves to up convert an IF or baseband outbound signal to an RF signal. The local oscillator (LO) 708 including the DPLL as discussed above provides a received local oscillating source $LO_R$ for the receiver 706 so it can perform its down converting function. Similarly, the local oscillator (LO) 708 provides a transmit local oscillating source $LO_T$ for the transmitter 712 so it can perform its up converting function. Although the transceiver 700 is used to exemplify one application of the DPLL, it shall be understood that the DPLL may be used in other applications, such as in a receiver, transmitter, clock and data recovery circuit, etc.

In one or more exemplary embodiments, the functions described may be implemented in hardware, software, firmware, or any combination thereof. If implemented in software, the functions may be stored on or transmitted over as one or more instructions or code on a computer-readable medium. Computer-readable media includes both computer storage media and communication media including any medium that facilitates transfer of a computer program from one place to another. A storage media may be any available media that can be accessed by a general purpose or special purpose computer. By way of example, and not limitation, such computer-readable media can comprise RAM, ROM, EEPROM, CD-ROM or other optical disk storage, magnetic disk storage or other magnetic storage devices, or any other medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, includes compact disc (CD), laser disc, optical disc, digital versatile disc (DVD), floppy disk and blu-ray disc where disks usually reproduce data magnetically, while discs reproduce data optically with lasers. Combinations of the above should also be included within the scope of computer-readable media.

While the invention has been described in connection with various aspects, it will be understood that the invention is capable of further modifications. This application is intended to cover any variations, uses or adaptation of the invention following, in general, the principles of the invention, and including such departures from the present disclosure as come within the known and customary practice within the art to which the invention pertains.

What is claimed is:

1. An apparatus, comprising a control unit adapted to:
receive a phase error signal from a phase error device of a phase locked loop (PLL), and set a width of a gated clock signal for a time-to-digital-converter (TDC) to an operating value based on the phase error signal, wherein the control unit is adapted to:
set the width of the gated clock signal to a default value;
monitor the phase error signal from the phase error device;
decrease the width of the gated clock signal below the default value;
set the width of the gated clock signal to the operating value in response to the phase error signal arriving substantially at or crossing a predetermined threshold.

2. The apparatus of claim 1, wherein the control unit is adapted to increase the width of the gated clock signal at the time when the phase error signal substantially arrives at or crosses the predetermined threshold in order to provide a margin of error to the operating value of the width of the gated clock signal.

3. The apparatus of claim 1, wherein the control unit comprises:
a first generator adapted to generate a first gating signal; and
a second generator adapted to generate a second gating signal, wherein a first edge of the first gating signal and a second edge of the second gating signal controls the width of the gated clock signal.

4. The apparatus of claim 3, wherein the control unit further comprises logic adapted to generate the gated clock signal from the first and second gating signals and an output clock signal.

5. The apparatus of claim 3, wherein the first generator comprises a first chain of delay elements with respective outputs coupled to inputs of a first multiplexer, and wherein the first chain of delay elements are adapted to receive a first reference clock.

6. The apparatus of claim 5, wherein the second generator comprises a second chain of delay elements with respective outputs coupled to inputs of a second multiplexer, and wherein the second chain of delay elements is coupled to an output of the first chain of delay elements.

7. The apparatus of claim 6, wherein the control unit further comprises a controller adapted to generate a first select signal to cause the first multiplexer to select an output signal of one delay element of the first chain to be used as the first gating signal.

8. The apparatus of claim 7, wherein the controller is further adapted to generate a second select signal to cause the second multiplexer to select an output signal of one delay element of the second chain to be used as the second gating signal.

9. The apparatus of claim 8, wherein the control unit further comprises a first programmable counter adapted to generate the first select signal in response to the controller, and a second programmable counter adapted to generate the second select signal in response to the controller.

10. The apparatus of claim 1, further comprising:
a filter adapted to generate an oscillator control signal based on the phase error signal;
an oscillator adapted to generate an output signal based on the oscillator control signal, wherein a phase of the gated clock signal is related to a phase of the output signal;
a first accumulator adapted to generate a first feedback phase signal related to a coarse measurement of the phase of the output signal, wherein the TDC is adapted to generate a second feedback phase signal related to a fine measurement of the phase of the output signal;
a summing device adapted to generate a feedback phase signal by combining the first and second feedback phase signals; and a second accumulator adapted to generate an input phase signal, wherein the phase error signal is related to a difference between the input phase signal and the feedback phase signal.

11. A method of calibrating a width of a gating window for a time-to-digital converter (TDC), comprising:
receiving a phase error signal from a phase error device of a phase locked loop; and
calibrating the width of the gating window for the TDC based on the phase error signal, wherein calibrating the width of the gating window for the TDC comprises:
setting the width of the gating window to a default value;
operating the phase locked loop until it is substantially locked;
decreasing the width of the gating window;
monitoring the phase error signal; and
setting the width of the gating window to an operating value in response to the phase error signal arriving substantially at or crossing a predetermined threshold.

12. The method of claim 11, wherein calibrating the width of the gating window for the TDC further comprises increasing the width of the gating window at a time when the phase error signal substantially arrives at or crosses the predetermined threshold in order to apply a margin of error to the operating value of the width of the gating window.

13. The method of claim 11, further comprising
generating a first gating signal; and
generating a second gating signal, wherein a first edge of the first gating signal and a second edge of the second gating signals controls the width of the gating window.

14. An apparatus, comprising:
means for receiving a phase error signal from a phase error device of a phase locked loop (PLL);
means for setting a width of a gated clock signal for a time-to-digital-converter (TDC) to an operating value based on the phase error signal, wherein the width setting means comprises:
means for setting the width of the gated clock signal to a default value;
means for monitoring the phase error signal from the phase error device; and
means for decreasing the width of the gated clock signal to the operating value in response to the phase error signal arriving substantially at crossing a predetermined threshold.

15. The apparatus of claim 14, wherein the width setting means further comprises means for increasing the width of the gated clock signal at the time when the phase error signal substantially arrives or crosses the predetermined threshold in order to provide a margin of error to the operating value of the width of the gated clock signal.

16. The apparatus of claim 14, wherein the width setting means comprises:
a first means for generating a first gating signal; and
a second means for generating a second gating signal, wherein a first edge of the first gating signal and a second edge of the second gating signal controls the width of the gated clock signal.

17. The apparatus of claim 16, wherein the width setting means further comprises means for generating the gated clock signal from the first and second gating signals and an output clock signal.

18. The apparatus of claim 16, wherein the first generating means comprises:
means for generating a first set of distinct delayed clock signals; and
means for selecting one of these distinct delayed clock signals of the first set as the first gating signal.

19. The apparatus of claim 18, wherein the second generating means comprises:
means for generating a second set of distinct delayed clock signals; and
means for selecting one of these distinct delayed clock signals of the second set as the second gating signal.

20. The apparatus of claim 14, further comprising:
means for generating an oscillator control signal based on the phase error signal;
means for generating an output signal based on the oscillator control signal, wherein a phase of the gated clock signal is related to a phase of the output signal;
means for generating a first feedback phase signal related to a coarse measurement of the phase of the output signal, wherein the TDC is adapted to generate a second feedback phase signal related to a fine measurement of the phase of the output signal;
means for generating a feedback phase signal by combining the first and second feedback phase signals; and
means for generating an input phase signal, wherein the phase error signal is related to a difference between the input phase signal and the feedback phase signal.

21. A communications device, comprising:
a receiver or a transmitter; and
a local oscillator (LO) adapted to generate a local oscillating source for the receiver or transmitter, wherein the local oscillator comprises a control unit adapted to receive a phase error signal from a phase error device of a phase locked loop (PLL), and set a width of a gated clock signal for a time-to-digital-converter (TDC) to an operating value based on the phase error signal, wherein the control unit is adapted to:
set the width of the gated clock signal to a default value;
monitor the phase error signal from the phase error device;
decrease the width of the gated clock signal below the default value; and
set the width of the gated clock signal to the operating value in response to the phase error signal arriving substantially at or crossing a predetermined threshold.

* * * * *